(12) United States Patent
Kobayashi et al.

(10) Patent No.: US 10,229,242 B2
(45) Date of Patent: Mar. 12, 2019

(54) METHOD OF DESIGNING TORSION BARS USED FOR TRUNK LID

(71) Applicant: NHK SPRING CO., LTD., Yokohama-shi, Kanagawa (JP)

(72) Inventors: Yoshio Kobayashi, Yokohama (JP); Shinichi Nishizawa, Walled Lake, MI (US); Nobuhisa Yasuda, Novi, MI (US)

(73) Assignee: NHK SPRING CO., LTD., Yokohama-shi, Kanagawa (JP)

( * ) Notice: Subject to any disclaimer, the term of this patent is extended or adjusted under 35 U.S.C. 154(b) by 259 days.

(21) Appl. No.: 15/086,009

(22) Filed: Mar. 30, 2016

(65) Prior Publication Data
US 2017/0286591 A1 Oct. 5, 2017

(51) Int. Cl.
*G06F 17/50* (2006.01)
*E05F 1/12* (2006.01)

(52) U.S. Cl.
CPC ...... *G06F 17/5086* (2013.01); *G06F 17/5018* (2013.01); *E05F 1/1238* (2013.01); *E05Y 2201/624* (2013.01); *E05Y 2900/548* (2013.01)

(58) Field of Classification Search
CPC .............. G06F 17/5086; G06F 17/5018; E05F 1/1238; E05Y 2201/624; E05Y 900/548; E05Y 2900/548
USPC ............................................................ 703/1
See application file for complete search history.

(56) References Cited

U.S. PATENT DOCUMENTS

| 8,214,184 B2 | 7/2012 | Nishizawa et al. |
| 9,476,237 B2 * | 10/2016 | Sato ...................... E05F 1/1033 |
| 2010/0275518 A1 * | 11/2010 | Nakazato ................ E05D 5/062 |
| | | 49/386 |

FOREIGN PATENT DOCUMENTS

JP         5393692 B2      1/2014

OTHER PUBLICATIONS

Zhang et al. "Design of Compliant Bistable Mechanism for Rear Trunk Lid of Cars"., Springer-Verlag Berlin Heidelberg 2011. 2 Pages.*

* cited by examiner

*Primary Examiner* — Eunhee Kim
(74) *Attorney, Agent, or Firm* — Holtz, Holtz & Volek PC

(57) ABSTRACT

In a design method of torsion bars used for a trunk lid, free shapes of the torsion bars unhitched from the trunk lid are designed. A center line model of the initial free shape is geometrically and statically created on the basis of a design specification. The center line model of an open shape is created from the free shape model and is deformed into a center line model of a closed modified shape. The center line models of the analyzed closed shape and the target closed shape is compared with each other to obtain a difference torque and a difference vector occurring between corresponding nodes on the center lines. The center line model is so changed as to decrease the difference torque and the difference vector.

12 Claims, 12 Drawing Sheets

Table 1

| | Left | Right |
|---|---|---|
| Material | SAE9254 | |
| Torque at closed [Nm] | 38.1±0.2 | |
| Full Stroke Angle [deg] | 93.3 | |
| Bar Diameter [mm] | 6.3 | |

FIG. 7

Table 2

| # | Bend radius | Left side | | | Right side | | |
|---|---|---|---|---|---|---|---|
| | | X | Y | Z | X | Y | Z |
| 1 | 12.5 | -993.5 | 96.3 | -59.6 | 993.5 | 96.3 | -59.6 |
| 2 | 12.5 | -1041.8 | 96.3 | -59.6 | 1041.8 | 96.3 | -59.6 |
| 3 | 12.5 | -1041.8 | 77.3 | -13.3 | 1041.8 | 77.3 | -13.3 |
| 4 | 12.5 | -950.8 | 77.3 | -13.3 | 950.8 | 77.3 | -13.3 |
| 5 | 12.5 | -847.3 | 55.2 | -86.3 | 847.3 | 82.5 | -98.9 |
| 6 | 12.5 | -680 | 7.2 | -96.9 | 680 | 24.3 | -121.6 |
| 7 | 12.5 | -311.7 | -19.6 | -41.3 | 311.7 | -19.6 | -41.3 |
| 8 | 12.5 | -112 | 0 | 0 | 112 | 0 | 0 |
| 9 | 12.5 | 0 | 0 | 0 | 0 | 0 | 0 |
| 10 | 12.5 | 0 | 55 | 0 | 0 | 65 | 0 |
| 11 | 12.5 | -18.4 | 55 | 0 | 18.4 | 65 | 0 |
| 12 | 12.5 | -32.9 | 40.5 | 0 | 32.9 | 50.5 | 0 |
| 13 | 12.5 | -81.3 | 40.5 | 0 | 81.3 | 50.5 | 0 |
| 14 | 12.5 | -81.3 | 15.5 | 0 | 81.3 | 25.5 | 0 |

FIG. 8

Table 3

| # | Bend radius | Left side | | | Right side | | |
|---|---|---|---|---|---|---|---|
| | | X | Y | Z | X | Y | Z |
| 4 | 12.5 | -951.0 | 77.3 | -13.2 | 951.0 | 77.2 | -13.2 |
| 5 | 12.5 | -843.3 | 55.2 | -98.3 | 845.6 | 69.4 | -109.9 |
| 6 | 12.5 | -672.0 | 7.5 | -111.4 | 671.8 | 14.8 | -108.5 |
| 7 | 12.5 | -306.4 | -27.8 | -52.7 | 305.6 | -5.0 | -60.0 |
| 8 | 12.5 | -109.1 | -3.7 | -22.6 | 109.4 | -4.3 | -22.5 |
| 9 | 12.5 | -15.0 | 0.0 | 0.0 | 15.0 | 0.0 | 0.0 |

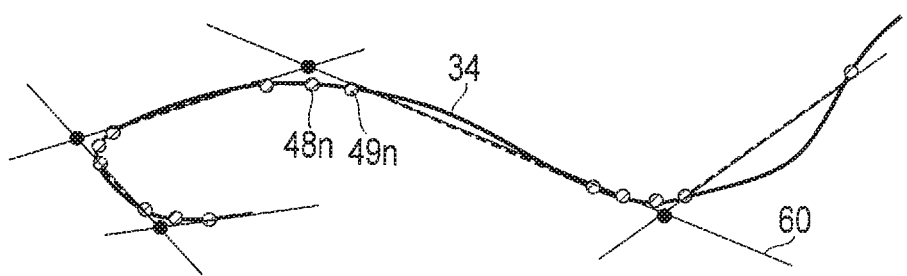
F I G. 14

METHOD OF DESIGNING TORSION BARS USED FOR TRUNK LID

BACKGROUND OF THE INVENTION

1. Field of the Invention

Embodiments described herein relate generally to a method of designing torsion bars to be used for a trunk lid and, more particularly, to a method of designing torsion bars to be utilized for keeping a trunk lid in position when the trunk lid is opened or closed.

2. Description of the Related Art

In a vehicle provided with a trunk, for example, a sedan, a trunk lid is attached to a body panel of the vehicle body in which the trunk is secured so that the trunk lid can be opened or closed. The trunk lid is supported by a retention mechanism of a damper type or a torsion-bar type and, when the trunk lid is to be opened or closed, this retention mechanism assists the trunk lid in rising or keeps the trunk lid open.

The torsion-bar type retention mechanism is constituted of a pair of torsion bars, each of fixed ends of the pair of torsion bars being attached and fixed to a right or left hinge base provided on each body panel and, each of the movable ends of the torsion bars being coupled to a right hinge arm or a left hinge arm rotatably provided on each body panel.

The pair of torsion bars is asymmetrically arranged inside the body panel of the vehicle body in order to avoid mutual interference. In a full stroke of the trunk lid, the torsion bars are each installed between the hinge bases and hinge arms while being twisted with retaining stress or restoring force, and are made to intersect each other with a certain gap maintained between the torsion bars in order that the torsion bars may not interfere with each other. When the trunk lid is to be opened, the restoring force from the twisted torsion bars is transmitted to the hinges so that the trunk lid is assisted in rising.

Such torsion bars are designed to have target closed shapes at a specific torque. A trunk lid torsion bar (TLTB) supplier acquires a bend point and torque at a closed trunk position given from a vehicle manufacturer as specifications, and designs torsion bars each having a free shape at the time before installation.

Heretofore, regarding a torsion bar, the torsion bar of a free shape is geometrically designed on the basis of a shape thereof at a closed trunk position based on the stress obtained by simple static mechanics. More specifically, the free shape (no-load shape) of the torsion bar is geometrically and statically determined from the shape of a torsion bar at a closed trunk position obtained by rotating a given bend point around a hinge axis of the trunk lid. In most cases in the conventional design method, a deformed trunk lid torsion bar (TLTB) shape at the closed position differs from a specific shape specified by the vehicle manufacturer, thereby frequently causing a problem that the torsion bar comes into contact with surrounding parts. Accordingly, after a prototype is delivered, the design of the torsion bar is started all over again many times.

In the conventional design method, a trunk lid torsion bar (TLTB) is statically designed on the basis of a formula of a torsion bar, and it is considered that although appropriate torque and a torsion bar rate can be found, a free shape cannot be identified with high accuracy, which can be deformed into a target closed shape specified by the vehicle manufacturer. Further, in the conventional design method, there is a problem that, in the design stage, it is not possible to evaluate the interference occurring throughout the full stroke concomitantly with the displacement of the torsion bars. Thus, it is required that many prototype torsion bars are manufactured on a trial-and-error basis.

Shinichi Nishizawa and Tadashi Sakai who are also the inventors of the present application have already proposed the algorithm of a design method of a coil spring in U.S. Pat. No. 8,214,184 B2 (to which Japanese Patent No. 5393692 corresponds). In this design method of a coil spring, a reverse engineering method based on finite element analysis is utilized to determine a free shape from a desired deformed shape with respect to a suspension coil spring. As with such a design method of the coil spring, in the design of a trunk lid torsion bar (TLTB), a proposal or a design method utilizing the reverse engineering method is also demanded.

BRIEF SUMMARY OF THE INVENTION

An object of the present invention is to provide an improved method of designing torsion bars used for a trunk lid.

According to the present invention, there is provided a design method of torsion bars used for a trunk lid, each of the torsion bars being given a target closed shape in a state where the trunk lid is closed, the design method of the torsion bar having the free shape comprising:

a step of inputting design specifications including target torque occurring in each of the torsion bars in the target closed shape, a rotational angle by which a movable end of each of the torsion bars is rotated from the target closed shape to an open shape, the target closed shape to be specified by coordinates of nodes, and a wire diameter of each of the torsion bars;

(b) a step of creating a center line model having the closed shape on the basis of the coordinates of the nodes;

(c) a step of geometrically and statically creating an initial free shape corresponding to the closed shape, and creating a center line model of the initial free shape on the basis of coordinates of a bend point of the free shape;

(d) a step of creating a center line model of the open shape on the basis of the center line model of the free shape, and rotating the center line model of the open shape by the rotational angle to thereby create a center line model of an analyzed closed shape;

(e) a step of obtaining difference torque between the target torque and analyzed torque of the analyzed closed shape;

(f) a step of comparing the center line models of the analyzed closed shape and the target closed shape with each other to thereby obtain a difference vector occurring between corresponding nodes on the center lines of the center line models; and (g) a step of changing the center line model so as to decrease the amplitudes of the difference torque and the difference vector, when the amplitudes of the difference torque and the difference vector are not both within predetermined tolerances, respectively, and returning to the step (d), or a step of finishing the design method of the torsion bar, when the amplitudes of the difference torque and the difference vector are both within predetermined tolerances, respectively.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 7 is a table showing design specifications to be provided from a vehicle manufacturer, and a diameter of a torsion bar obtained by statics on the basis of the design specifications.

FIG. 8 is a table showing radii and coordinates of target bend points in the closed shape included in the design specifications to be provided from the vehicle manufacturer.

FIG. 14 is a perspective view schematically showing a change to a linear free shape realizing ease of manufacture in the design method of a torsion bar used for a trunk lid according to a modified embodiment.

DETAILED DESCRIPTION OF THE INVENTION

Various embodiments will be described hereinafter with reference to the accompanying drawings.

Figure 1:
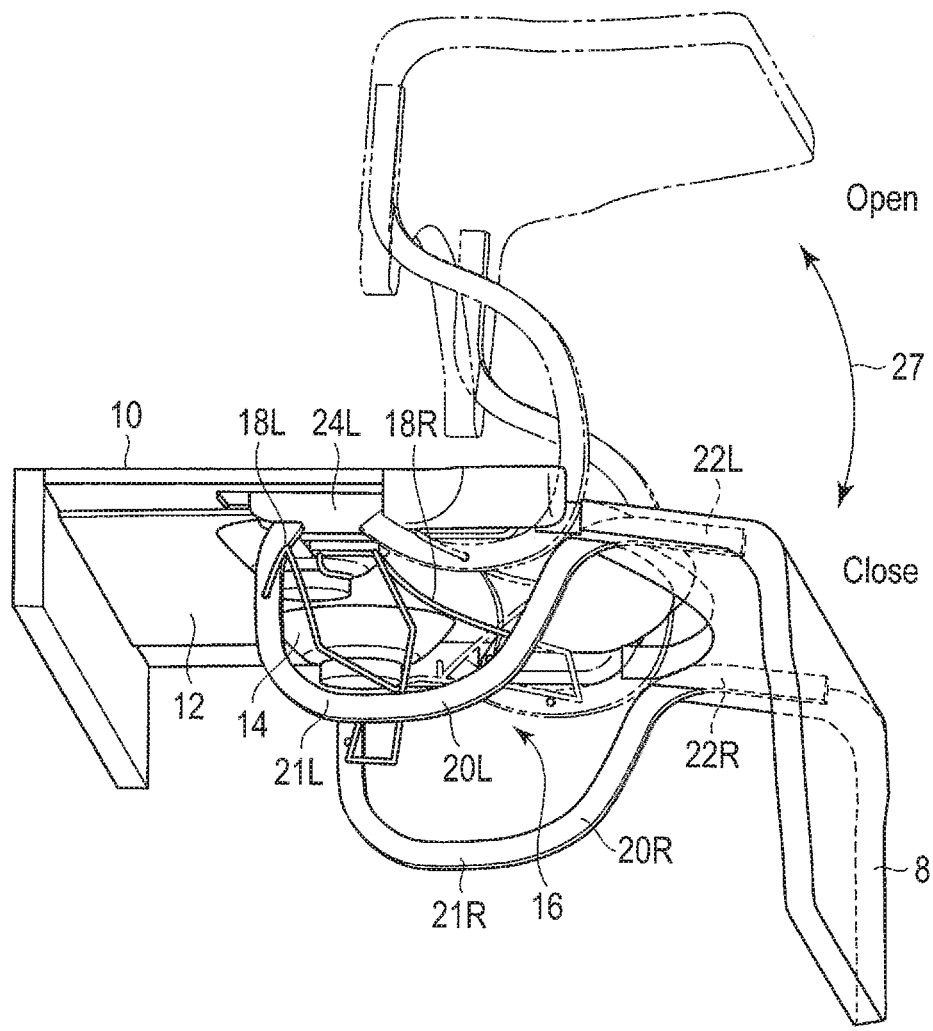
FIG. 1 is a perspective view schematically showing an intra-trunk structure having a retention mechanism utilizing torsion bars, the torsion bars being designed in accordance with an embodiment of an improved method of designing torsion bars used for a trunk lid.
Figure 2:
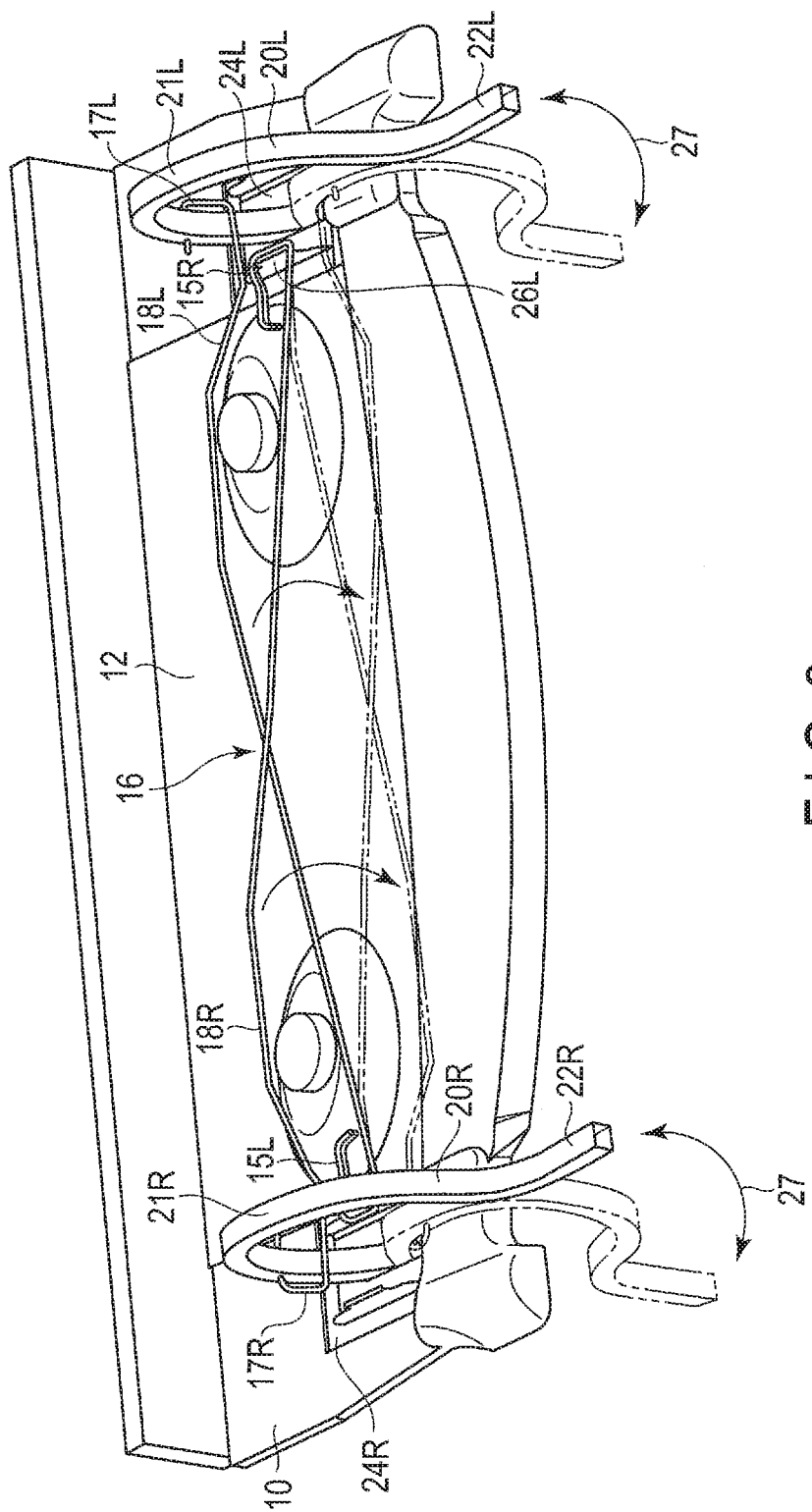
FIG. 2 is a perspective view schematically showing the intra-trunk structure shown in FIG. 1 by turning the structure upside down.

FIG. 1 schematically shows an intra-trunk structure having a retention mechanism which is constituted of torsion bars designed in accordance with an embodiment of an improved method of designing torsion bars used for a trunk lid. Further, FIG. 2 schematically shows the intra-trunk structure shown in FIG. 1 by turning the structure upside down. More specifically, FIG. 2 is depicted as a perspective view of an upper structure of a trunk room on the vehicle rear side obtained by viewing a retention mechanism from the ground side, the structure being turned upside down in the perspective view.

In sedan vehicle, a trunk room is provided on the rear side, and this trunk room is separated from the inside of the vehicle cabin by a panel 12 provided in a vehicle body 10. To the panel 12 shown in FIG. 1, various vehicle parts 14 such as a speaker directed to the inside of the vehicle cabin, and the like are attached. Right and left torsion bars 18R and 18L constituting a retention mechanism 16 are arranged to avoid the vehicle parts 14. The torsion bars 18L and 18R of the retention mechanism 16 shown in FIG. 1 are covered with a cover (not shown) defining the trunk room. In FIG. 1 and FIG. 2, the cover is removed in order to expose and explicitly show the retention mechanism 16.

Ends of hinge arms 20L and 20R configured to open or close the trunk lid 8 are rotatably coupled to hinge bases 24L and 24R fixed to the body panels of the vehicle body 10. Further, in the hinge arms 20L and 20R, linear sections 22L and 22R are linearly extended from curved sections (gooseneck sections) 21L and 21R. The trunk lid 8 is mounted on these linear sections 22L and 22R. In FIG. 1, the hinge arms 20L and 20R are rotated around the hinge axis (not shown) as indicated by arrows 27, whereby the trunk lid 8 is opened. In FIG. 1 and FIG. 2, the trunk lid 8, hinge arms 20L and 20R, and the like when the trunk lid 8 is closed are shown by solid lines, and the trunk lid 8, and hinge arms 20L and 20R, when the trunk lid 8 is open are shown by broken lines.

An end of the left torsion bar 18L is hitched on an engaging section (not shown) provided on the right hinge base 24R as a fixed end 15L to thereby be fixed, and another end of the bar 18L is coupled to the curved section (gooseneck) 21L of the left hinge arm 20L as a movable end 17L. Further, an end of the right torsion bar 18R is hitched on an engaging section 26L provided on the left hinge base 24L as a fixed end 15R to thereby be fixed, and another end of the bar 18R is coupled to the curved section (gooseneck) 21R of the right hinge arm 20R as a movable end 17R. These torsion bars 18R and 18L are respectively twisted between the fixed ends 15R and 15L and movable ends 17R and 17L, and are arranged asymmetrically in such a manner that they intersect each other so that they can avoid mutual interference inside the body panel of the vehicle body.

In the retention mechanism constituted of the right and left torsion bars 18R and 18L, when the trunk lid 8 is in the closed state, the right and left torsion bars 18R and 18L are given torsion stress, and are fixed in a state where restoring force serving as reaction force is still continuously given to them. Accordingly, in the state where the trunk lid 8 is closed, the restoring force is applied to the curved sections (goosenecks) 21R and 21L on the movable end sides from the right and left torsion bars 18R and 18L.

The restoring force to be given from the torsion bars 18L and 18R is intentionally designed in such a manner that a restoring force produced at a trunk rid opening angle is balanced with the mass of the hinge arms 20R and 20L, and trunk lid 8. This trunk rid opening angle is so set in a manner that the trunk lid 8 is slightly open when the trunk lid key-mechanism is released, and the trunk lid 8 is maintained in an open attitude at this trunk rid opening angle. Even when the trunk lid 8 is opened to the maximum angle, the trunk lid is prevented, by virtue of the restoring force produced by the torsion bars 18L and 18R, from being easily rotated to be closed even if the external force is applied to the trunk lid.

As shown in FIG. 2, in the state where the trunk lid 8 is closed, the torsion bars 18L and 18R have certain closed shapes. Further, in the state where the trunk lid is fully open, the torsion bars 18L and 18R have open shapes. Furthermore, in the unloaded state where the torsion bars are unhitched from the hinge arms 20L and 20R, the torsion bars 18L and 18R have certain free shapes (no-load shapes). It is required that the torsion bars 18L and 18R be designed in such a manner that the torsion bars 18L and 18R do not interfere with parts including the vehicle parts 14 not only when they have the closed shapes, but also in the full stroke of the torsion bars.

Figure 3:
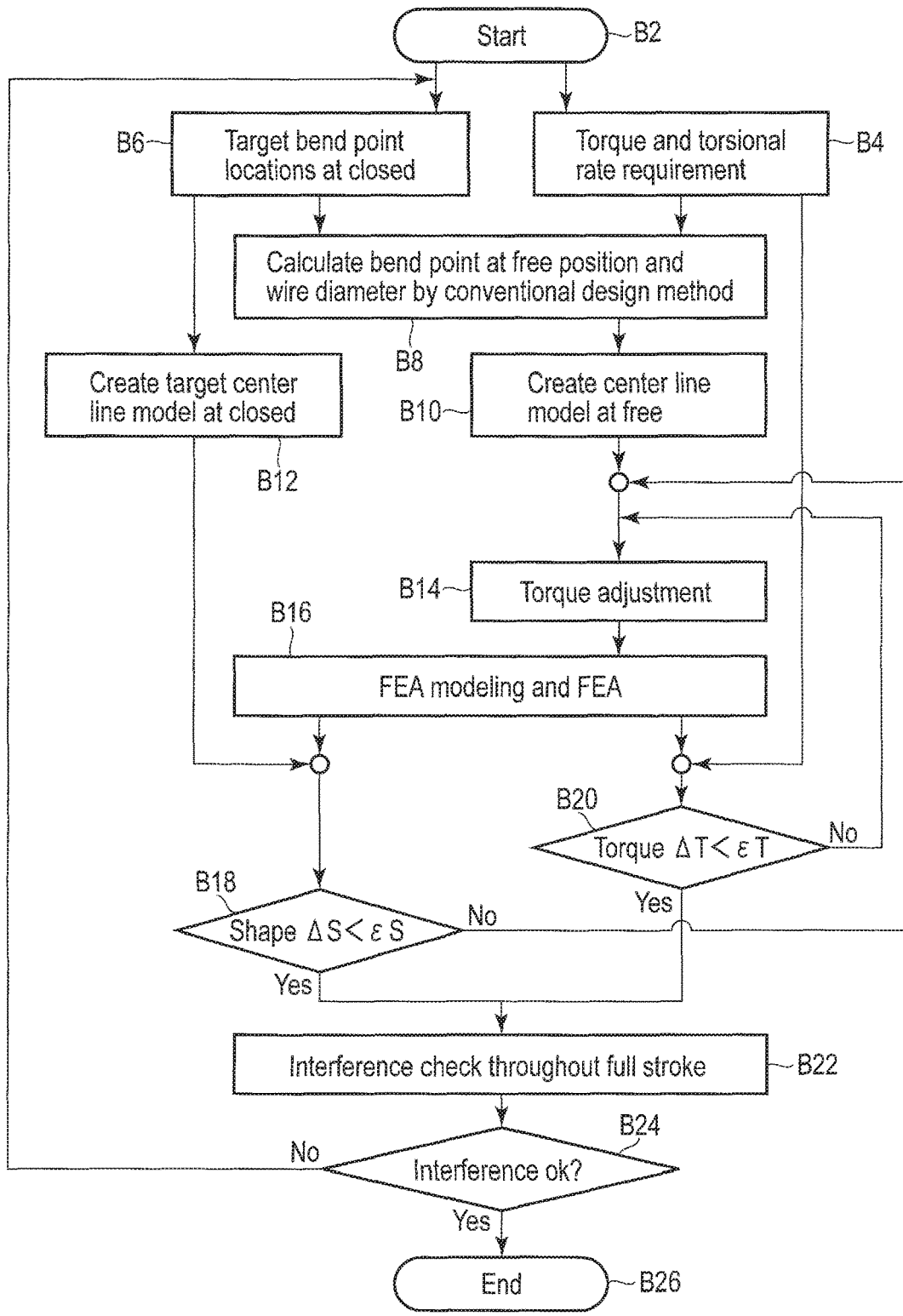
FIG. 3 is a block diagram showing algorithm of CAE realizing a design method of torsion bars used for a trunk lid according to the embodiment, the algorithm of CAE utilizing finite element analysis (FEA) to be executed on a computer (not shown).

Such torsion bars 18L and 18R are designed by computer aided engineering (CAE) utilizing finite element analysis (FEA). In FIG. 3, the algorithm of CAE utilizing finite element analysis (FEA) to be executed by a program on a processor of a computer (not shown) is shown. This algorithm not only simply utilizes finite element analysis (FEA), but also utilizes, as in the case of the design method of the coil spring disclosed in U.S. Pat. No. 8,214,184 B2, the reverse engineering method based on finite element analysis (FEA) to thereby design the free shapes of the torsion bars 18L and 18R.

When the free shapes of the torsion bars 18L and 18R are to be designed, design specifications of the torsion bars 18L and 18R are specified as boundary conditions of the trunk lid 8 by the vehicle manufacturer which is the consignee of the torsion bars 18L and 18R. In the specifications, request torque of the torsion bars 18L and 18R in the closed shapes, torsion bar rate of the torsion bars 18L and 18R, and closed shapes of the torsion bars 18L and 18R are specified.

Figure 4:
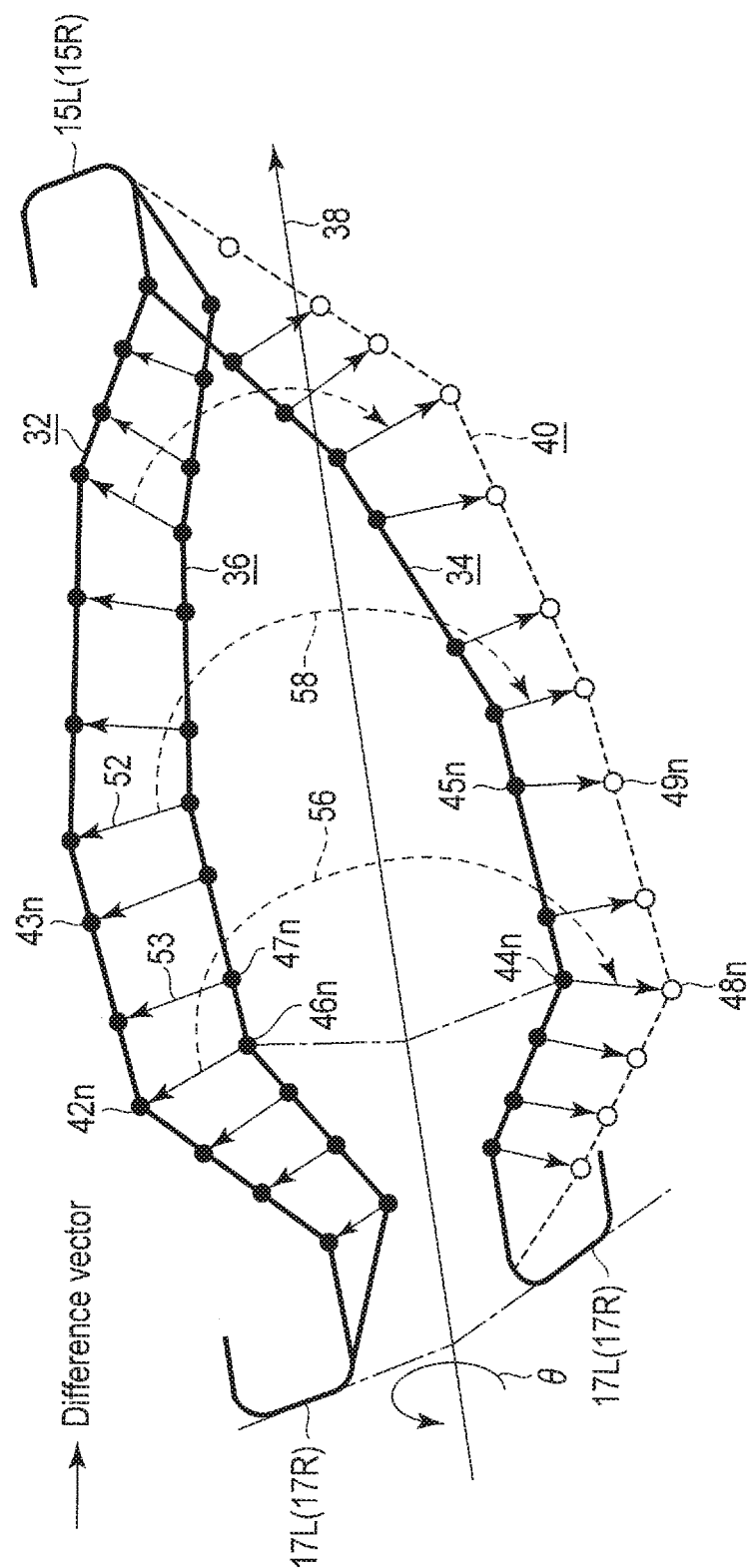
FIG. 4 is a schematic view showing a center line model of torsion bars around a hinge axis to be used for explaining the design method of torsion bars used for a trunk lid according to the embodiment.

Here, the torsion bar rates of the torsion bars 18L and 18R are important elements used to control an opening speed of the trunk lid 8a and a holding force which maintained the trunk lid 8 to be open, in a wide range of situations such as a vehicle stop on an incline, a trunk rid opening in a strong wind, and the like. Thus, the torsion bar rates of the torsion bars 18L and 18R are specified as required specifications from these viewpoints. Further, regarding the closed shapes of the torsion bars 18L and 18R, the targeted closed shapes are specified as a target center line model 32 as shown in FIG. 4 by specifying a position of a bend point or node (not shown). The target center line model 32 of the torsion bars 18L and 18R includes linear portions which are substantially lineally extended and a bent portion which connects the adjacent linear portions, as shown in FIG. 4. The bend point (node) is defined as a crossing point of the adjacent linear portions, and a peculiar point 42*n* on the curved portion of the center line model 32, which corresponds to the bend point (node), is specified based on bending information about the torsion bar and coordinate information of the bend point (node).

In the CAE design shown in FIG. 3, when the design is started (block B2), the above-mentioned design specifications are input to the computer as preprocessing of the CAE process. In block B4, the request torque T and the required torsion bar rate k of the torsion bars are input. Further, in block B6, the position of the target bend point of the torsion bar 18L and 18R in the target closed shape is input. On the basis of the input design specifications, a wire diameter d of the torsion bars 18L and 18R is calculated based on statics.

Further, positions of bend points (nodes) in the free shape of the torsion bars 18L and 18R are calculated (block B8). Furthermore, in a modified embodiment in which interpolation points 43*n* are specified between the bend points, positions of the interpolation points 43*n* may be calculated in addition to the positions of the peculiar points 42*n* (block B8). In block B8, bend point (node) positions are obtained, peculiar points (nodes) 44*n* are specified from the bend point (node) positions and the free shape is determined as an initial center line model by statics based on the conventional method (block B10). More specifically, the initial center line model having the free shape is determined by the static and geometrical method on the basis of the model 32 of the target shape at the closed trunk position. In this shape determination, the free shape may be determined by, for example, simply rotating the target shape model around the hinge axis 38. Further, on the basis of a position of a bend point of the free shape, the initial center line model 34 of the free shape is created as shown in FIG. 4 (block B10).

In the analytical processing of the CAE process, in block B12, the target center line model 32 of the torsion bars 18L and 18R in the target closed shape is created as shown in FIG. 4 based on positions of the target bend points which are input in the block B6. The target bend positions and positions of points 43*n* each interpolated between the target bend positions are determined in the target center line model 32. Here, the peculiar point 42*n* of the target center line model 32 corresponds to a peculiar point 44*n* of the initial center line model 34, and the interpolation points 43*n* of the target center line model 32 also corresponds to interpolation points 45*n* of the initial center line model 34.

The free center line model 34, which have been subjected to shape and torque adjustments, undergoes FEA calculation based on a boundary condition in which the free center line model 34 is rotated around the hinge axis 38 of the trunk lid 8 by an angle θ (block B16), so that a first center line model 36 of the closed shape is obtained. The transformation from the free shape (i.e., the free center line model 34) to the closed shape (i.e., the first center line model 36) includes a change in shape to be caused by being twisted on the movable end side by an angle Δθ at the time of transformation (attaching to the trunk lid) from the free shape to the open shape, and a change in shape to be caused by being rotated from the open shape to the closed shape by the angle θ.

The wire diameter d, torsion bar rate k, and difference angle Δθ created between the center line model 34 of the free shape and center line model (not shown) of the open shape are statically given by the formulas shown below.

$$d = \sqrt[3]{\frac{6T}{\pi\tau}} \quad (1)$$

$$k = \frac{\pi G d^4}{32L} \quad (2)$$

$$\Delta\theta = \frac{T}{k} - \theta \quad (3)$$

In the above formulae, T is the torque at the closed position; T, the maximum stress; G, the rigidity modulus; L, the distance between the both ends of the torsion bar 18L or 18R; and θ, the rotational angle around the hinge axis 38 to be created when the center line model of the open shape is rotated to the center line model 36 of the closed shape.

The closed center line model 36 having the closed shape which is calculated by the FEA includes a peculiar point (node) 46n and an interpolation point (node) 47n which correspond to the peculiar point (node) 44n and the interpolation point (node) 45n on the free center line model 34, respectively. The peculiar point (node) 46n and the interpolation point (node) 47n on the closed center line model 36 are obtained by the rotation and deformation of the free center line model 34 based on the FEA processing. The first center line model 36 obtained on the basis of the FEA processing of the first time does not coincide with the target center line model 32 of the target closed shape, the peculiar point (node) 46n and the interpolation point (node) 47n do not coincide with the target peculiar point 42n and interpolation point 43n on the target center line model 32, thus a difference vector 52 is created between the peculiar point (node) 46n and the peculiar point (node) 42n, and a difference vector 53 is created between the interpolation point (node) 47n and the interpolation point (node) 43n as shown in FIG. 4. These difference vectors 52 and 53 are created on the basis of a difference between the obtained center line model and the target closed center line model. Accordingly, when ΔS of each of the difference vectors 52 and 53 is greater than a given tolerance (εS) (block B18), the difference vectors 52 and 53 are converted into those in the predetermined directions as indicated by arrows 56 and 58 as shown in FIG. 4, then are subjected to feedback to the free center line model 34, and the free center line model 34 is changed into the modified center line model 40 having a modified free shape. That is, the center line model 34 is modified by the difference vectors 52 and 53 to thereby be modified into the center line model 40 including the peculiar point (node) 48n and interpolation point (node) 49n.

Further, in the FEA analyzing process, analyzed torque created in the center line model of the analyzed closed shape is obtained (block B16). When ΔT of the difference between this analyzed torque and target torque is also greater than a given tolerance (εT) (block B20), the difference is subjected to feedback to the free center line model 40, and the shape of the center line model 40 is modified, whereby the torque is adjusted (block B14).

When the feedback from block B14 to block B20 is repeated, the difference vectors 52 and 53 are reduced, and the torque difference ΔT is also reduced, whereby the designed closed shape is brought closer to an allowable target closed shape. Here, when size ΔS of each of the difference vectors 52 and 53 remains within a given tolerance (εS), and the torque difference ΔT also remains within a given tolerance (εT), the designed closed shape is regarded as being brought closer to an allowable target closed shape, and an interference check serving as post-processing in the CAE process is carried out (block B22). In the interference check, various shapes of the torsion bars 18L and 18R at various trunk angles, which includes not only the open and closed shapes and another shapes are depicted on CAD, and it is checked whether or not the various shapes of the torsion bars 18L and 18R do not interfere with the surrounding parts at a full stroke angles (block B24). When interference between the torsion bars 18L and 18R and the parts occurs, there is a possibility of the optimum free shape model being unable to be obtained. Accordingly, the designers regard a physical solution satisfying all the requirements, as being unable to be found, request the vehicle manufacturer to change the model of the target shape, and carry out the processing from block B6 to block B24 again on the basis of the changed target shape. When it turns out in block B24 that no interference occurs, it is considered that an optimum free shape model 40 has been designed, and the processing is terminated (block B26).

The feedback of the difference vectors 52 and 53 to the center line model 34 of the free shape previously described with reference to FIG. 4 will be described in more detail with reference to FIG. 5.

Figure 5:
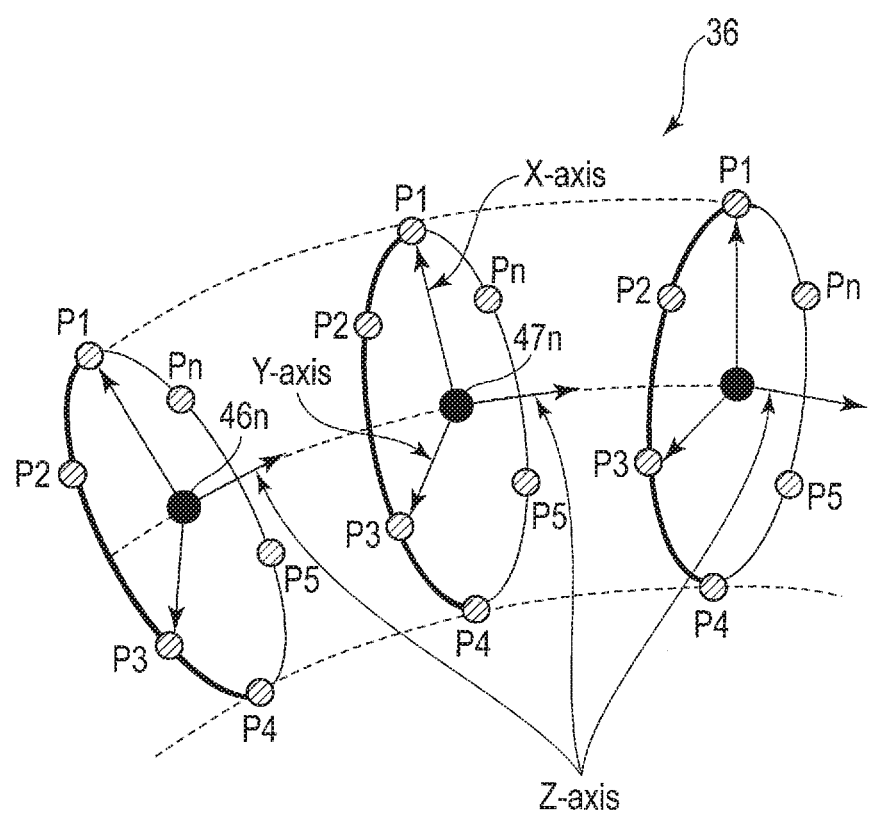
FIG. 5 is a schematic view conceptually showing a local coordinate system indicating linear cross sections on points of the center line model shown in FIG. 4.

Whereas the feedback of the difference vectors 52 and 53 in a global coordinate system is shown in FIG. 4, FIG. 5 is a conceptual view for explaining the feedback processing of the difference vectors 52 and 53 by utilizing a local coordinate system at a cross section of the torsion bar 18R or 18L. Each local coordinate system is determined with each node (center point) on the center line model set as a center thereof. When a solid (three-dimensional) mesh model is created, coordinate points ($P_1, P_2, P_3, \ldots, P_n$) at a line cross section of the torsion bar are assigned to positions around each node. The x-axis is defined as an axis extending in a direction from the central node to the coordinate point ($P_1$) on the surface. The z-axis is determined along the center line at all times. First, a shape difference vector at each central node in the global area coordinate system is converted into vector on the corresponding local coordinate system of the deformed shape at the outset. Then, this vector is added to the peculiar central point (node) of the free shape in the local coordinate system, and the shape of the center line model of the free shape is changed.

It should be noted that the feedback of the above-mentioned shape given to neither the fixed end nor the movable end.

In the local coordinate systems shown in FIG. 5, linear cross sections at a peculiar point 46n on the curved portion and interpolation point 47n on the linear portion in the center line model 36 are shown, and surface coordinate points ($P_1, P_2, P_3, \ldots, P_n$) specified by the x and y local coordinates are provided on the cross-sectional outer periphery of the torsion bar 18L or 18R around the z-axis connecting the peculiar point 46n and the interpolation point 47n to each other. Between the analyzed center line model 36 and target center line model 32, the difference vectors 52 and 53 concomitant with the rotation deviation of the torsion bar 18L or 18R are created as already described. In the global coordinate system, these difference vectors 52 and 53 are given as, for example, vectors respectively directed from the peculiar point 46n and interpolation point 47n to the peculiar point 42n and the interpolation point 43n. These difference vectors 52 and 53 respectively extend from the peculiar point 46n and interpolation point 47n via positions between the surface coordinate points ($P_1, P_2, P_3, \ldots, P_n$), and hence if the point $P_n$ is specified, each of directions in which the difference vectors 52 and 53 are fed back is specified.

These difference vectors 52 and 53 on the peculiar node 46n and the interpolation node 47n are expressed in the local coordinate systems relating to the closed shape shown in FIG. 5, and are simply added to the peculiar node 44n and the interpolation node 45n on the free center model 34 in the local coordinate systems, which corresponds to the free shape. In this analyzing process, the free center model 34 is twisted into the analyzed center line model 36.

Figure 6A:
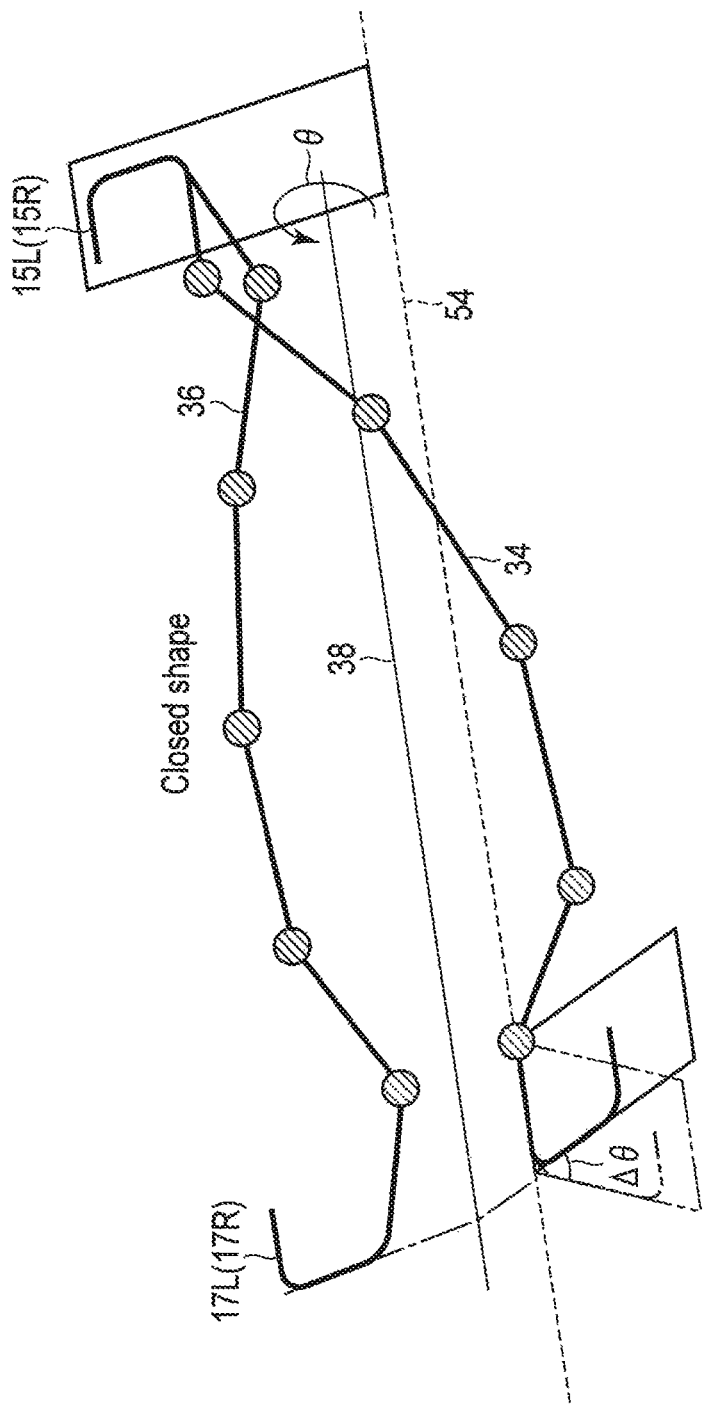
FIG. 6A is a schematic view showing a concept used for explaining adjustment of torque in the torsion bar shown in FIG. 4.
Figure 6B:
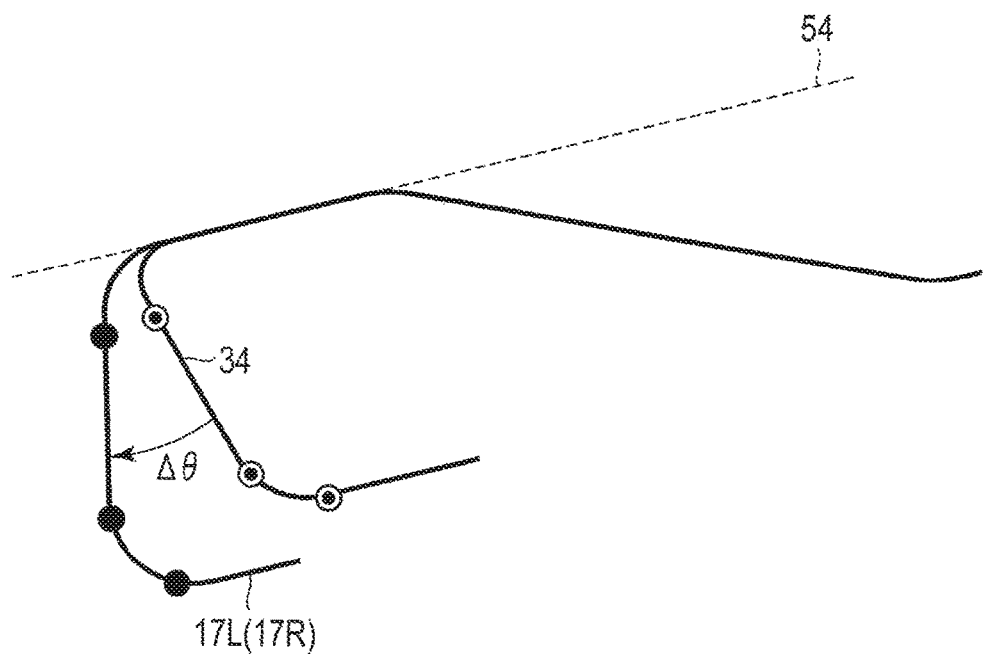
FIG. 6B is an enlarged schematic view showing torque adjustment at a movable end of the torsion bar shown in FIG. 6A.

In block B14, in order to satisfy the specification about the torque at the closed shape, a relative angle between the fixed end 15L (15R) and the movable end 17L (17R) of the torsion bar 18L or 18R is adjusted. The center line model 34 of the free shape is determined without load, whereas, as shown in FIG. 6A and FIG. 6B, the movable end 17L (17R) side of the center line model 34 of the free shape is twisted around the installation axis 54 by an amount of angle Δθ to thereby be given torque, and the center line model 34 is deformed into a center line model (not shown) of the open shape. Here, the installation axis 54 is determined as a reference axis of the movable end 17L (17R) parallel to the hinge axis 38.

Example of Design Sample

Specifications of the torsion bars 18L and 18R which have been used for verification of the proposed design algorithm are shown in Table 1 of FIG. 7, and Table 2 of FIG. 8. In Table 1, torque and the full stroke angle around the hinge axis 38 of the torsion bars 18L and 18R in the closed shape are given as the design specifications. The torsion bar diameter shown in Table 1 is obtained from the specifications by statics on the basis of the conventional design method.

Further, in Table 2, there is shown coordinates (x, y, z) of bending points in the global coordinate system of each of the right and left torsion bars 18R and 18L having the target closed shape which is made the target of design. In the torsion bars 18L and 18R to be designed, indices are given to bend points, and the indices are given in ascending order starting at the movable ends (17L, 17R) and ending at the fixed ends (15L, 15R). Indices #1 to #3 and indices #9 to #14 respectively indicate the movable ends (17L, 17R) and fixed ends which are connected to holding fixtures. The feedback to the free shape previously described with reference to FIG. 4 is not applied to these movable ends (17L, 17R) and fixed ends (15L, 15R), but is applied to peculiar point 44n between the movable ends (17L, 17R) and fixed ends (15L, 15R), and indicated by indices #4 to #8.

Figure 9:
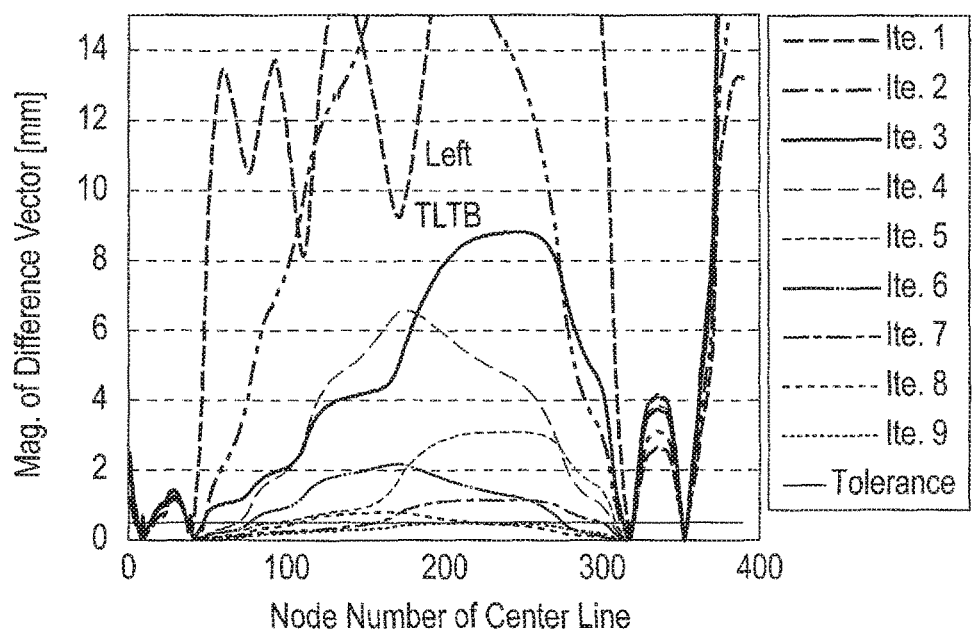
FIG. 9 is a graph showing a state where difference vectors to be repetitively obtained are made to converge on the basis of analysis in the design method of a left torsion bar used for a trunk lid according to the embodiment.
Figure 10:
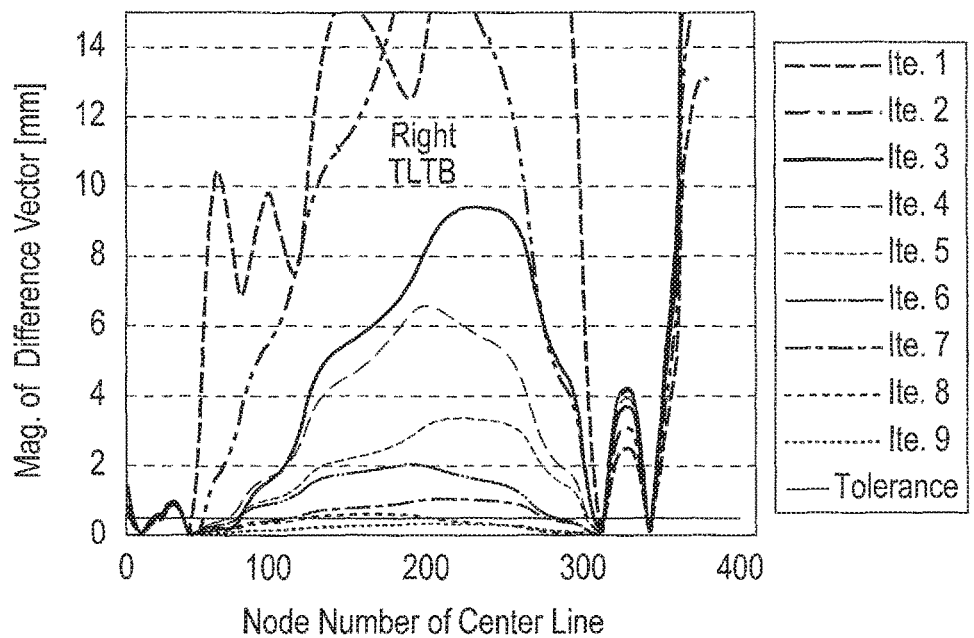
FIG. 10 is a graph showing a state where difference vectors are made to converge to a range of allowable values on the basis of analysis in the design method of a right torsion bar used for the trunk lid according to the embodiment.

In FIG. 9 and FIG. 10, a state where difference vectors to be repetitively obtained are made to converge to a range of allowable values on the basis of analysis in the design method of right and left torsion bars used for a trunk lid according to the embodiment is shown. The vertical axis in each of FIG. 9 and FIG. 10 indicates the magnitude of the difference vectors, and the horizontal axis indicates the positions along the center line of the closed shape model in node number. Regarding the feedback of the difference vectors, the difference vectors are repetitively fed back to the free shape as many as nine times as indicated by analysis ite.1 to ite.9 (Iteration 1~Iteration 9). In the example shown in FIG. 9 and FIG. 10, the difference vectors are made to converge to a tolerance, for example, 0.5 mm or less by the feedback of nine times in total.

Figures 11, 13:
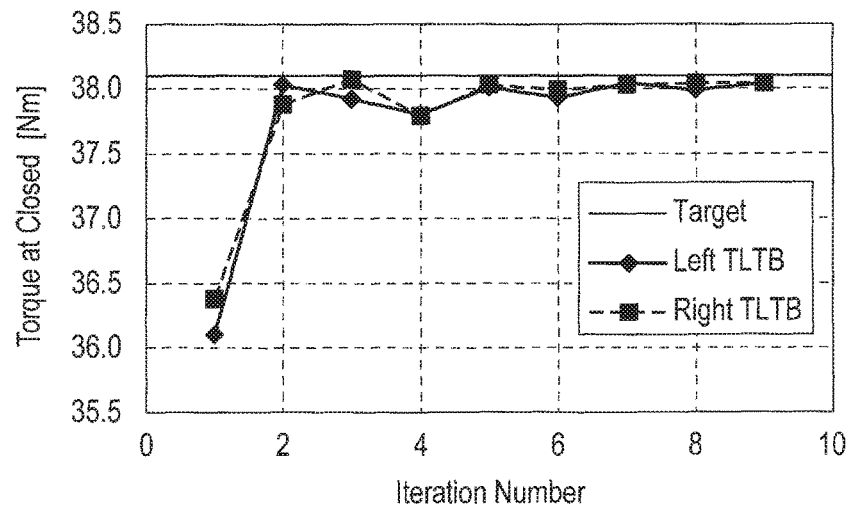
FIG. 11 is a graph showing a state where torques in the closed shape to be analyzed and repetitively obtained by the design method of the right and left torsion bars used for the trunk lid according to the embodiment are made to converge to a target torque.
FIG. 13 is a table showing coordinates of target bend points in the closed shape included in the changed design specifications to be given again in the processing of FIG. 3.

FIG. 11 shows a state where torques occurring in the closed shape of each of the right and left torsion bars to be analyzed and repetitively obtained by the design method of the right and left torsion bars used for the trunk lid according to the embodiment are made to converge to a target torque. In FIG. 11, the vertical axis indicates torque of the closed shape to be repetitively designed, and the horizontal axis indicates positions along the center line of the closed shape model in node number. As shown in FIG. 11, it can be understood that it is possible to make the analyzed torque closer to the target torque by the repetitive feedback.

As described above, according to this embodiment, it is possible to design a free shape capable of taking the target closed shape.

Figure 12:
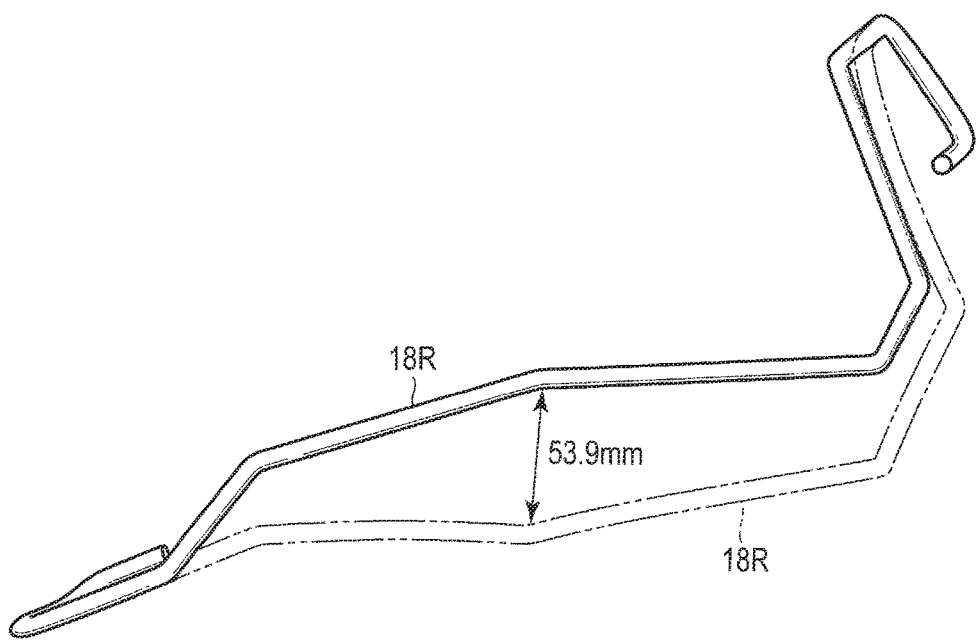
FIG. 12 is a perspective view schematically showing a torsion bar having a free shape designed in accordance with this embodiment, and torsion bar having an initial free shape designed by the conventional design method in a comparative manner.

In FIG. 12, a torsion bar 18R having a free shape, designed in accordance with this embodiment, and depicted by solid lines, and a right torsion bar 18R having an initial free shape, designed by the conventional design method, and depicted by broken lines are shown in a comparative manner. Between the above torsion bars, although there is a difference of as much as, for example, 53.9 mm, it is possible to design a free shape capable of making the analyzed closed shape approximately coincide with the target closed shape by repetitively feeding back the difference vectors between the analyzed closed shape and target closed shape to the free shape as already described previously.

Change of Target Closed Shape

In the example, it is possible to make the analyzed closed shape according to the ninth analysis loop ite.9 approximately coincide with the target closed shape by the repetitive feedback as shown in FIG. 9 to FIG. 11. However, as described previously with reference to block B24, when interference with parts occurs in the interference check to be carried out throughout the full stroke of each of the torsion bars 18L and 18R, the targeted closed shape is changed as shown in the table shown in FIG. 13.

In the table shown in FIG. 13, a bend point 48n is newly added to a position between each of the movable ends (17L, 17R) and fixed ends (15L, 15R) in Table 2 shown in FIG. 8, and new indices #4 to #9 are set in place of indices #4 to #8. A closed shape to be made the new target is determined in accordance with the coordinates of the new indices #4 to #9. On the basis of the new closed shape, the processing from block B6 to block B24 is carried out again, and an optimum free shape model 40 is designed. In a change of the target closed shape, in stead of adding new bending points, the coordinates of the current bending points may be altered and new coordinates of the current bending points are set to specify the new target closed shape.

Design of Free Shape Taking Manufacture into Consideration

The free shape is tend to be designed by the method according to this embodiment being designed in such a manner that the shape is bent between bend points 48n as shown in FIG. 12 and FIG. 14. In the manufacturing equipment (not shown) of a general bending machine type, there is a problem that it is difficult for the equipment to give a form of a free shape bent exactly as designed to the torsion bars 18L and 18R to be manufactured of straight wire. In this manufacturing equipment of the general bending machine type, straight wire is locked in the curving pin to thereby be bent, and thus the torsion bars 18L and 18R of the designed free shape are manufactured. Accordingly, it is difficult to manufacture the torsion bars 18L and 18R of a free shape which has a curved portion between bend points 48n as shown in FIG. 14.

Therefore, in the method of this embodiment, in consideration of the manufacturing, the bending points are extracted from the analyzed closed shape and only the difference vector between the bending point on the analyzed closed shape and the bending point on the target closed shape is applied to the free shape. All of the difference vectors on the center line model are not feedback to the free shape, and therefore the free shape is designed to have a straight portion between the bending points at all time.

Torsion Bars Fastened by Clips

Two trunk lid torsion bars come into contact with each other near the central point, and thus a rubbing noise or a contact noise occurs. In order to avoid such a situation, trunk lid torsion bars are often clipped (not shown) to each other at the intersection point or are fixed to the vehicle structure. In the design algorithm of the torsion bars 18L and 10R fixed by a clip, the clip fastening point is specified when a center line model of a free shape is created and, in the process from block B10 to block B16 shown in FIG. 3, analysis is carried out on the premise that the center line model of the free shape is rotated with restrictions imposed thereon. Further, it is checked whether or not interference with the surrounding parts occurs throughout the full stroke on the premise that displacement of both the torsion bars 18L and 10R is suppressed by the clip.

As has been described above, it is possible to provide a design method of torsion bars used for a trunk lid which makes it possible to design a torsion bar having a free shape to be deformed into a targeted closed shape satisfying specifications in a simple way.

What is claimed is:

1. A method of designing a torsion bar used for a trunk lid, the torsion bar being given a target closed shape in a state in which the trunk lid is closed and an open state in which the trunk lid is open, and being given a free shape in a free state in which the torsion bar is unhitched from the trunk lid, the method comprising:
    (a) a step of inputting design specifications including target torque occurring in the torsion bar in the target closed shape, a rotational angle by which a movable end of the torsion bar is rotated from the target closed shape to the open shape, the target closed shape to be specified by coordinates of nodes, and a wire diameter of the torsion bar;
    (b) a step of creating a center line model of the target closed shape based on the coordinates of the nodes of the target closed shape;
    (c) a step of geometrically and statically creating the free shape corresponding to the target closed shape, and creating a center line model of the free shape based on coordinates of nodes of the free shape;
    (d) a step of creating a center line model of the open shape based on the center line model of the free shape, and rotating the center line model of the open shape by the rotational angle to thereby create a center line model of an analyzed closed shape;
    (e) a step of obtaining difference torque between the target torque and an analyzed torque of the analyzed closed shape;
    (f) a step of comparing the center line models of the analyzed closed shape and the target closed shape with each other to thereby obtain a difference vector occurring between corresponding nodes on center lines of the center line models of the analyzed closed shape and the target closed shape;
    (g) a step of changing the center line model of the free shape so as to decrease amplitudes of the difference torque and the difference vector, thereby obtaining a modified center line model of a modified free shape, when the amplitudes of the difference torque and the difference vector are not both within predetermined tolerances, respectively, and returning to the step (d) so as to repeat the steps (d) through (g) based on the modified center line model of the modified free shape; and
    (h) a step of finishing a design of the torsion bar, when the amplitudes of the difference torque and the difference vector are both within the predetermined tolerances, respectively.

2. The method of claim 1, wherein the step (d) comprises:
    a step of rotating a movable end of the center line model of the free shape by an angle $\Delta\theta$, which is set based on the target torque, thereby creating the center line model of the open shape; and
    a step of rotating the center line model of the open shape by the rotational angle to thereby create the center line model of the analyzed closed shape.

3. The method of claim 1, wherein the center line model of the target closed shape is created based on a calculation of bending points for the torsion bar and has curved and linear portions on which the nodes are set.

4. The method of claim 1, wherein the step (h) comprises, when the amplitudes of the difference torque and the difference vector are both within the predetermined tolerances, respectively:
    determining the center line model of the analyzed closed shape as a final model; and
    determining the center line model of the free shape corresponding to the final model as the design of the torsion bar.

5. The method of claim 4, further comprising:
    (i) a step of simulating a locus of a full stroke of the final model concomitant with opening and closing of the trunk lid to check for interference with other vehicle parts.

6. The method of claim 5, further comprising changing the target closed shape in response to the step (i) indicating that the final model interferes with the other vehicle parts, and performing steps (b) through (i) based on the changed target closed shape.

7. The method of claim 6, wherein the changing the target closed shape includes adding or removing a bend point for the torsion bar in the target closed shape.

8. The method of claim 4, wherein steps (a) through (h) are performed for a pair of torsion bars, to obtain final models and designs for the pair of torsion bars; and
    wherein the method further comprises:
    (i) a step of simulating loci of full strokes of the final models for the pair of torsion bars concomitant with opening and closing of the trunk lid to check for interference with other vehicle parts.

9. The method of claim 8, wherein the step (i) is carried out on the premise that the torsion bars are fixed to each other.

10. A design device comprising a processor and a memory storing a program executable by the processor to perform the method of claim 1.

11. A method of designing a torsion bar used for a trunk lid, the torsion bar being given a target closed shape in a state in which the trunk lid is closed and an open state in which the trunk lid is open, and being given a free shape in a free state in which the torsion bar is unhitched from the trunk lid, the method comprising:
    (a) a step of inputting design specifications including target torque occurring in the torsion bar in the target closed shape, a rotational angle by which a movable end of the torsion bar is rotated from the target closed shape to the open shape, the target closed shape specified by coordinates of bending points of the torsion bar, and a wire diameter of the torsion bar;
    (b) a step of creating a center line model of the target closed shape based on the coordinates of the bending points of the target closed shape;
    (c) a step of geometrically and statically creating the free shape corresponding to the target closed shape, and creating a center line model of the free shape based on coordinates of bending points of the free shape;
    (d) a step of creating a center line model of the open shape based on the center line model of the free shape, and rotating the center line model of the open shape by the rotational angle to thereby create a center line model of an analyzed closed shape;
    (e) a step of obtaining difference torque between the target torque and analyzed torque of the analyzed closed shape;

(f) a step of comparing the center line models of the analyzed closed shape and the target closed shape with each other to thereby obtain a difference vector occurring between corresponding bending points for the analyzed closed shape and the target closed shape;

(g) a step of changing the center line model of the free shape so as to decrease amplitudes of the difference torque and the difference vector, thereby obtaining a modified center line model of a modified free shape, when the amplitudes of the difference torque and the difference vector are not both within predetermined tolerances, respectively, and returning to the step (d) so as to repeat the steps (d) through (q) based on the modified center line model of the modified free shape; and (h) a step of finishing a design of the torsion bar, when the amplitudes of the difference torque and the difference vector are both within the predetermined tolerances, respectively.

12. A design device comprising a processor and a memory storing a program executable by the processor to perform the method of claim 11.

* * * * *